(12) United States Patent
Yeh

(10) Patent No.: US 6,861,668 B2
(45) Date of Patent: Mar. 1, 2005

(54) THIN FILM TRANSISTOR (TFT) AND METHOD FOR FABRICATING THE TFT

(76) Inventor: Wen-Chang Yeh, 43, Keelung Road, Section 4, Taipei (TW)

(*) Notice: Subject to any disclaimer, the term of this patent is extended or adjusted under 35 U.S.C. 154(b) by 19 days.

(21) Appl. No.: 10/249,446

(22) Filed: Apr. 10, 2003

(65) Prior Publication Data

US 2003/0193068 A1 Oct. 16, 2003

(30) Foreign Application Priority Data

Apr. 11, 2002 (JP) ........................................ 2002-145465

(51) Int. Cl.⁷ .............................................. H01L 29/04
(52) U.S. Cl. ......................................... 257/49; 438/487
(58) Field of Search ................................. 257/347, 524, 257/586, 45, 51, 66, 49; 438/479, 481, 487

(56) References Cited

U.S. PATENT DOCUMENTS 4,269,631 A * 5/1981 Anantha et al. ............ 438/349

* cited by examiner

*Primary Examiner*—Sara Crane
(74) *Attorney, Agent, or Firm*—Jiang Chyun IP Office

(57) ABSTRACT

The present invention provides a simple method for forming the poly-Si and single crystalline Si TFT, which includes forming a line peninsular layer extending from an a-Si island layer at the active region. Then, a laser annealing process is performed, so that the re-crystallization will occur starting from an end of the line peninsular layer and then form the silicon island layer, serving as the active region for the TFT.

25 Claims, 5 Drawing Sheets

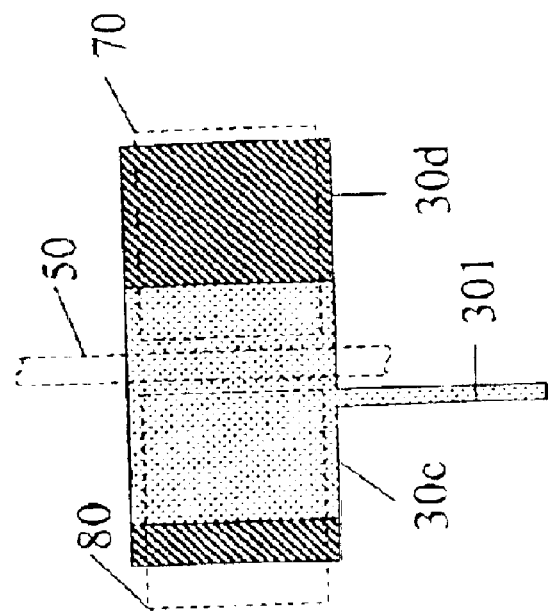
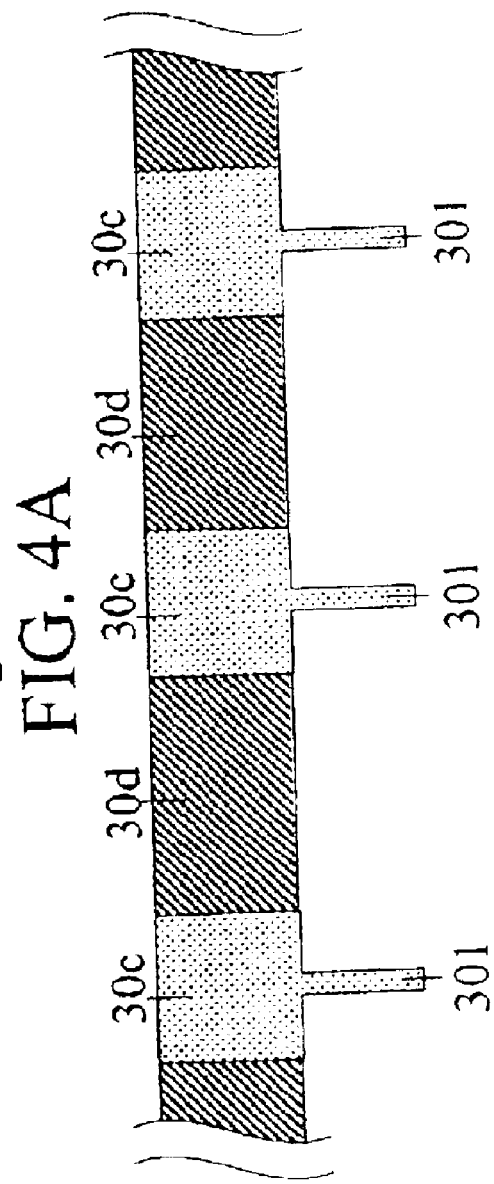
FIG. 4A
FIG. 4B

THIN FILM TRANSISTOR (TFT) AND METHOD FOR FABRICATING THE TFT

CROSS REFERENCE TO RELATED APPLICATIONS

This application claims the priority benefit of Japanese application Ser. no. 2002-145465, filed Apr. 11, 2002.

BACKGROUND OF INVENTION

1. Field of Invention

The present invention relates to technology of thin film transistor (TFT). More particularly, the present invention relates to a structure of TFT and a method for forming a TFT using a crystallization property from a excimer laser.

2. Description of Related Art

In general for the specification, the semiconductor material includes, for example, silicon or germanium, and the transistor is fabricated by the semiconductor material and can be used to form a device, such as a displaying device, a switching device and so on.

In recent years, a lot of research and development are made about the TFT, which is commonly used in the driving circuit for the active liquid crystal display (LCD) or the active organic electro-luminance (EL) display. The TFT can be generally categorized into a polysilicon TFT (poly-Si TFT) and amorphous-silicon TFT (a-Si TFT).

For the poly-Si TFT, it has rather higher mobility, so that in the future it can be used to form the pixel switching device or the peripheral driving circuit for the displaying device but also it can be used in a memory device or an information processing system.

If the information processing circuit is desired to be fabricated by using TFT, the mobility of TFT should be greater than 500 $cm^2$/V-s. However, since the current polysilicon grain boundary usually is the scattering center with respect to the electrons, the mobility is hard to be greater than 100 $cm^2$/V-s. In order to achieve 500 $cm^2$/V-s for the TFT, it is necessary to use the single-crystal silicon TFT (c-Si TFT).

The conventional method to form a polysilicon film under a temperature of 500° C. is using an excimer laser to irradiate the a-Si film, so as to cause the silicon film to be melt and re-crystallized. Since this method does not produce a thermal damage on the substrate, it is considered to be highly effective. However, this method can only obtain the polysilicon film with relatively smaller grain size.

Recently, a sequential lateral solidification (SLS) was proposed by J. S. Im et al. (Phys. Stat. Sol. (a) 166(1998) 603), which successfully produce a polysilicon film with the grain length of 100 microns. Since this grain size is longer than the channel length of the TFT, the electrons in motion actually do not cross over the grain boundary. As a result, this is equivalent to achieve the c-Si TFT, of which the mobility can be greater than 500 $cm^2$/V-s. However, the method has several disadvantages that it needs a more expensive optical system, the using efficiency for the laser source is low, and the property of TFT is lack of uniformity due to a poor control of the grain boundary along the direction parallel to the scanning direction.

In addition in recent years, a method is also developed, wherein the crystal grain is formed at the determined position, so as to reduce the grain boundary at the TFT channel region, such as changing the grade level of the light intensity for the laser. Again, this method is also relying upon the expensive optical system, and the grain boundary along the lateral growth derection cannot be controled.

SUMMARY OF INVENTION

One of the objectives of the invention is to provide a simple method for forming the poly-Si or single crystalline Si TFT.

The present invention provides a simple method for forming the poly-Si or single crystalline Si TFT, so as to at least improve the mobility and get a uniform property by excluding the issues of grain boundary in chanel region in the poly-Si TFT, capable of use in LCD.

The present invention provides a simple method for forming the poly-Si or single crystalline Si TFT, which includes forming a line peninsular extending from an a-Si island at the active region. Then, a laser annealing process is performed, so that the re-crystallization will occur starting from a part of the line peninsular and then the crystal will grow from the peninsular toward the Si island, resulting in single crystallization of the silicon island, serving as the active region for the TFT.

BRIEF DESCRIPTION OF DRAWINGS

The accompanying drawings are included to provide a further understanding of the invention, and are incorporated in and constitute a part of this specification. The drawings illustrate embodiments of the invention and, together with the description, serve to explain the principles of the invention. In the drawings.

FIGS. 4A–4B are the top views, schematically illustrating the shape of the semiconductor island and the result of crystallization, according to embodiments of the invention.

DETAILED DESCRIPTION

Figure 1A:
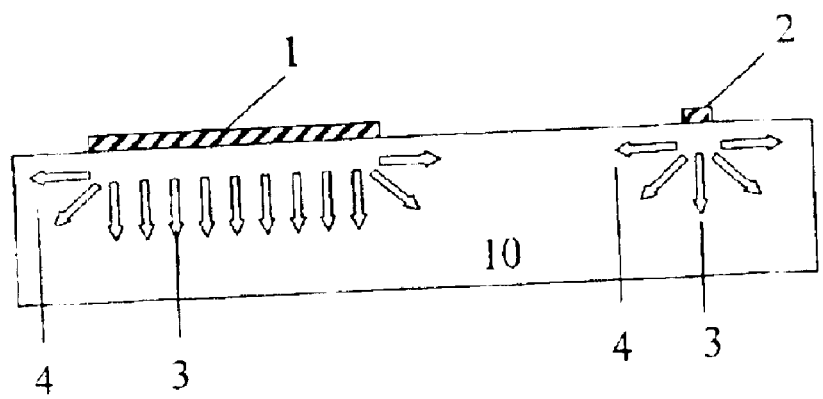
FIGS. 1A–1C are the cross-sectional views, schematically illustrating the mechanism of the planar thermal diffusion and line thermal diffusion, according to the present invention.
Figure 1B:
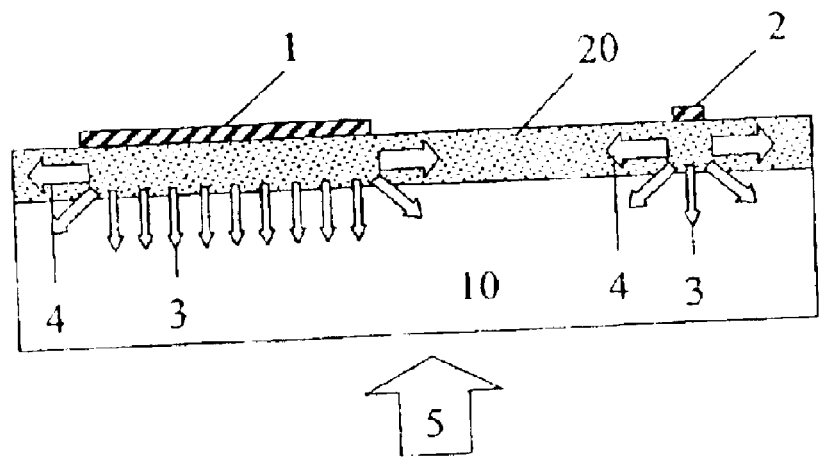
Figure 1C:
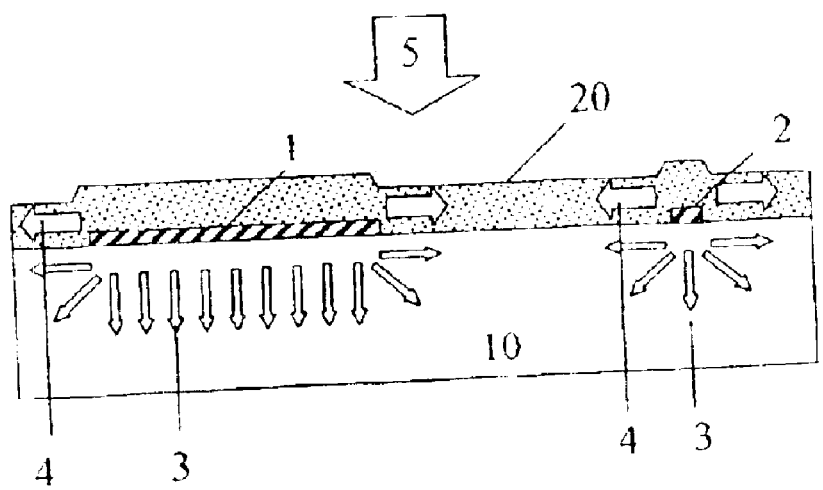

Generally, during the melting and recrystalization process of semiconductor film after laser irradiation, the temperature change for the semiconductor film after irradiating the laser light is like a planar thermal diffusion. The surface temperature will change by a rate inversely proportional to a square root of cooling time duration. FIGS. 1A–1C are the cross-sectional views, schematically illustrating the mechanism of the thermal diffusion in the invention. In FIG. 1A, as for the semiconductor island region 1 after irradiating by the laser light, because the total downward thermal flux 3 is much greater than the total lateral thermal flux 4, the lateral thermal flux 4 is ignorable and therefore it appears to be the planar thermal diffusion source. On the other hand, when the width of the island 2 has been greatly reduced to be a line-like structure, the total lateral thermal flux 4 is then comparable with the total downward thermal flux 3 without ignorance. In this situation, the temperature will be reduced in a faster rate, and this situation is considered as a line thermal diffusion source, of which the temperature decreasing rate is inversely proportional to the cooling time duration. Usually, the types of the planar thermal diffusion source and the line thermal diffusion source are distinguished by using the thermal diffusion depth during the period of melting state as a reference for judgement. If the size of the semiconductor island is greater than the thermal diffusion depth, then the temperature variation on the semiconductor film is approaching to the planar thermal diffusion source. Otherwise, the temperature variation on the semiconductor film is approaching to the line thermal diffusion source. When the line width get smaller, the line thermal diffusion is then more obvious.

Figure 2A:
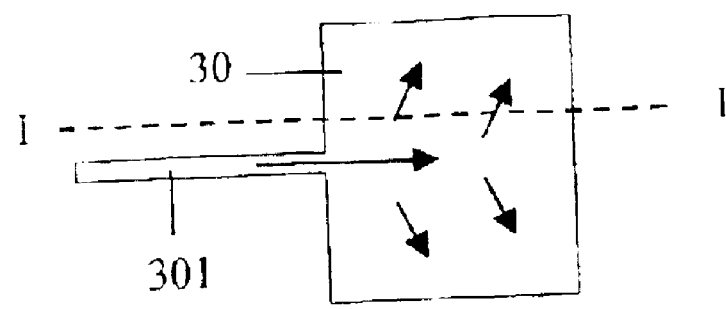
FIGS. 2A–2D are the top view and cross-sectional views, schematically illustrating performing a laser annealing process on the semiconductor island in TFT fabrication process, according to 1–4 preferred embodiments of the invention.

In the conventional situation that the laser is used to melt the semiconductor island in planar thermal diffusion type and re-crystallize it, the temperature in the island is uniformly decreased. As a result, the nuclei for crystallization are randomly produced and it is impossible to obtain a single grain. The invention has considered the difference of temperature decreasing rates for the planar thermal diffusion and the line thermal diffusion, so as to control the staring position of re-crystallization for the melted semiconductor film. In better detail as shown in FIG. 2A, the semiconductor island 30 in the planar thermal diffusion has a line peninsular 301 extending out. After the laser light source melt the semiconductor island 30 and the line peninsular 301, the line peninsular 301 will be first re-crystallized. The crystallization directions are shown by the arrows, wherein the crystallization starts from the line peninsular 301 and then gradually reaches to the semiconductor island 30. In this manner, the semiconductor island 30 can be crystallized as about a single-crystal. Several embodiments are provided as the examples of the invention.

Embodiment 1

Figure 2B:
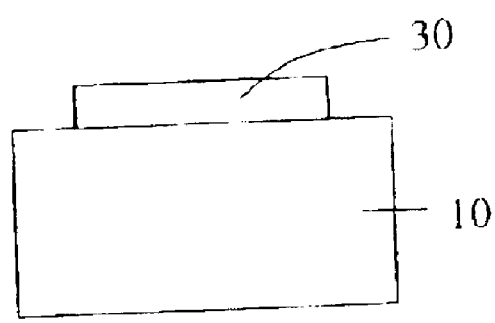
Figure 2C:
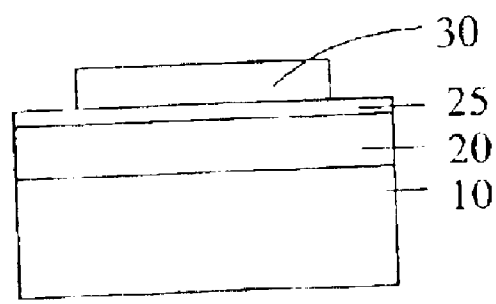
Figure 2D:
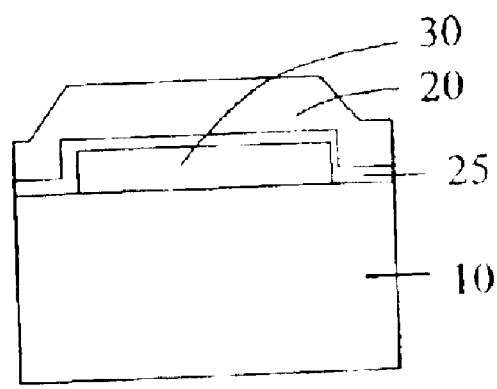

FIGS. 2B–2D are cross-section views, schematically the fabricating processes for the different structures of TFT along the line I—I in FIG. 2A. In FIGS. 2A and 2B, a substrate 10, such as a glass substrate or quartz substrate, is deposited with an amorphous silicon (a-Si) film, which serves as the semiconductor film 30. The deposition is performed by, for example, low pressure chemical vapor deposition (LPCVD) with a thickness of 100 nm. The a-Si film 30 is patterned to have the shape as shown in FIG. 2A. The size of the a-Si island 30, which is to be used as the active region, for example is a square shape by 3 microns for the side length. The peninsula 301 has a width of, for example, less than 0.6 microns, and more preferably is less than 0.3 microns. The length is, for example, 2 microns. However, the width of the line peninsula 301 is not restricted to this quantity. The width of the line peninsula 301 can even up to 2 microns, so as to have the line thermal diffusion. In general, the line peninsula 301 is used to have the starting crystallization position before the a-Si film 30 is crystallized. If the a-Si film 30 has larger size as the planar thermal diffusion, it has been sufficient if a width of the line peninsula 301 can produce the starting crystallization position.

The a-Si film 30 is then irradiated by the laser light source at the substrate temperature of 900° C. When the melt duration of Si film is time t, then the thermal diffusion depth can be estimated to be $(4Dt)^{1/2}$, where D is the thermal diffusion coefficient of the substrate. Since the melt duration t of the Si film is about 500 ns, the thermal diffusion depth is then about 1 micron. The a-Si film 30 with the size of 3 $\mu m \times 3$ $\mu m$ is larger than thermal diffusion depth. Therefore, the a-Si film 30 is treated as a planar thermal diffusion source for the temperature decreasing rate, of which the temperature decreasing rate is inversely proportional to the square root of the time period t. The portion of the peninsula 301 has the width of 0.6 microns, which is less than the thermal diffusion depth of 1 micron, and therefore the peninsula 301 is a line thermal diffusion source, of which the temperature decreasing rate is tending to be inversely proportional to the time period t. If the width of the peninsula 301 is further reduced to 0.3 micron, the inversely proportional relation is more obvious. As a result, after the laser melts the a-Si film 30 and the a-Si line peninsula 301, the line peninsula 301 re-crystallizes prior to the a-Si film 30. The direction of crystallization is shown in FIG. 1A from the surface part. The a-Si film 30 thereby can be transformed into a single crystal structure as the c-Si film 30 serving as the active layer for the TFT.

After the c-Si active layer is formed, the subsequent processes for forming the TFT can be performed. For example, FIGS. 3A–3G are the processes to fabricate the TFT, wherein FIGS. 3A–3D are top views and FIGS. 3E–3G are cross-sectional views with respect to FIGS. 3A–3C cutting along the dashed-lines. In FIG. 3E, gate insulating layer 40 is formed over the substrate 10 by, for example, the chemical vapor deposition (CVD), such as the plasma enhanced CVD (PECVD) using tetra-ethy-ortho-silicate (TEOS) material, or a oxidation process to form the silicon oxide layer. The gate insulating layer 40 can also be formed before the laser annealing process on the a-Si film 30. In this manner, the gate insulating layer 40 with the a-Si film 30 can also be annealed in high temperature at the same time. Subsequently, a gate electrode layer 50 is formed on the gate insulating layer 40. The gate electrode layer 50 can be formed by, for example, depositing a conductive layer, such as Ta metal layer, over the gate insulating layer 40, and then patterning the conductive layer to form the gate electrode 50 as shown in FIG. 3B. In FIGS. 3C and 3G, the gate electrode layer 50 is used as a mask, an implantation process is performed, so as to form the source electrode 30a and the drain electrode 30b in the c-Si film 30, which is resulting from the a-Si film 30 being re-crystallized into single crystal structure. An insulating layer serving as the dielectric inter-layer layer 60, such as silicon oxide, is deposited over the gate insulating layer 40 and the gate electrode layer 50 by a thickness, such as 500 nm. An annealing process, such as furnace annealing or laser annealing, is performed to activate the dopants in the source/drain electrodes 30a, 30b and improve the quality of the gate insulating layer 40. The gate insulating layer 40 and the dielectric inter-layer 60 then is patterned to form contact openings 80 to expose the source/drain electrodes 30a, 30b and then the metal, such as Al, is deposited on the dielectric inter-layer 60 and on the contact openings 80, and then is patterned to form the source/drain leading line to accomplish the TFT.

Figure 3A:
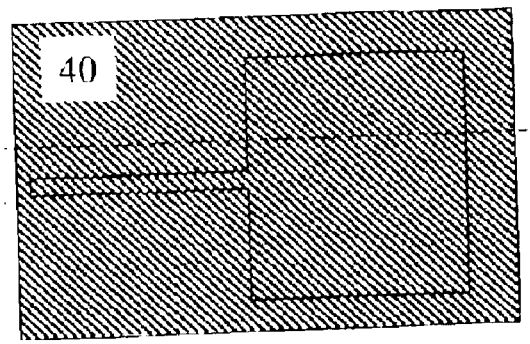
FIGS. 3A–3G are the top view and cross-sectional views, schematically illustrating the subsequent TFT fabrication process after laser annealing process on the semiconductor island, according to 1–3 preferred embodiments of the invention.
Figure 3E:
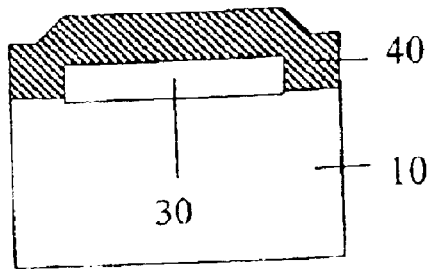
Figure 3B:
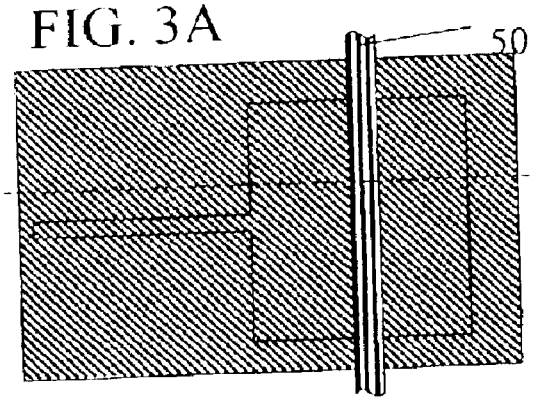
Figure 3F:
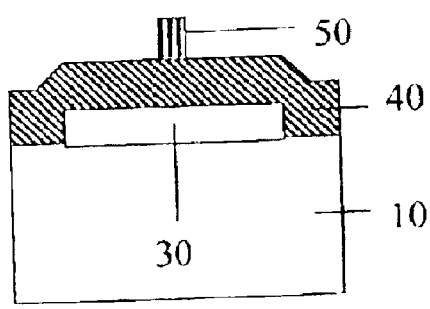
Figure 3C:
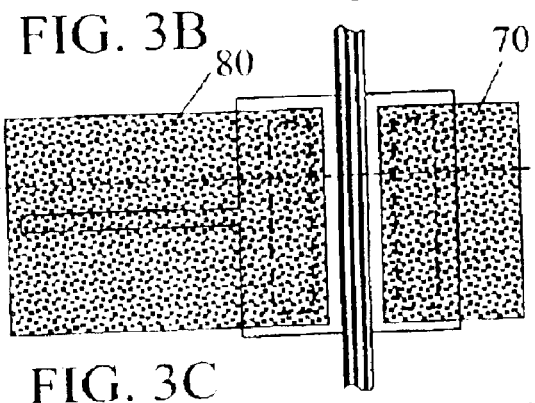
Figure 3G:
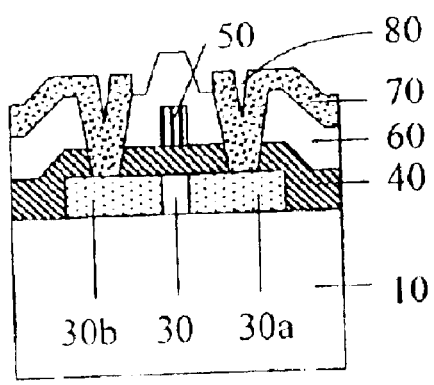
Figure 3D:
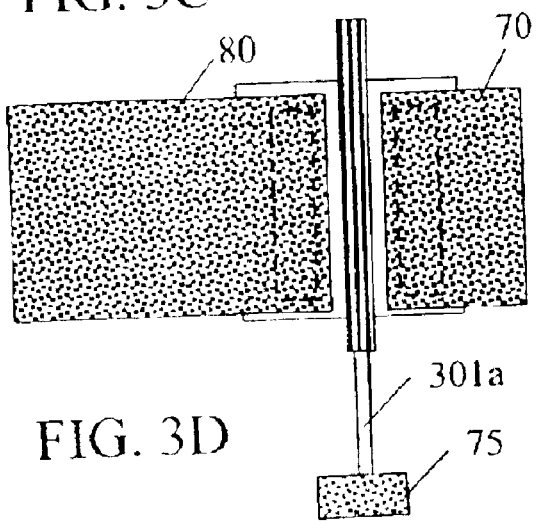

Further still in FIG. 3D, the line peninsula 301 can also be arranged along the direction of the gate electrode 50 being overlapping. After an implantation process with desired conductive type of dopants on the line peninsula 301, the line peninsula 301 can bed used as a lateral body terminal, so as to remove a kink effect.

Embodiment 2

Alternatively, another method in second embodiment for fabricating the TFT is described in FIGS. 2A and 2C. First, a porous silicon oxide layer is coated on a substrate 10, such as a glass substrate or a plastic substrate. The porous silicon oxide layer 20 serves as a low thermal capacity layer 20 at bottom. In the embodiment, the spin on glass (SOG) process can be used to form the low thermal capacity layer 20 with a thickness of 2 microns and the porosity of about 50%. After an annealing process is performed, such as a temperature of 500° C. for 30 minutes, a buffering layer 25 is formed on the low thermal capacity layer 20. The buffering layer 25 can be formed from TEOS oxide by PECVD with a thickness of about 200 nm. An amorphous silicon layer 30 is formed on the buffering layer 25 by, for example, low pressure CVD (LPCVD) at a temperature of 500° C. using Si $H_6$ as the material source. The a-Si layer 30 has a thickness of, for example, $100^2$ nm and serves as a semiconductor layer 30. In FIG. 2A, the a-Si layer 30 is, for example, patterned to have the semiconductor island 30 with length of 10 microns. And the peninsula 301 has the width of, for example, about 2 microns with 4 microns in length. Then the semiconductor island 30 and the peninsula 301 is irradiated by excimer laser at the substrate temperature of 500° C. For this dimension, the thermal diffusion depth is estimated to be about 1.5 microns. With respect to this condition, the semiconductor island 30 has the size of 10 micron×10 microns, which is much greater than the thermal diffusion depth, and therefore the temperature decreasing type is the planar thermal diffusion source and is inversely proportional to square root of cooling time duration. For the peninsula 301, it has the width of 2 microns, which is close to 1.5 microns of thermal diffusion depth. As a result, the peninsula 301 is approaching to the line thermal diffusion source and the temperature decreasing rate is about inversely proportional to the cooling time duration. If the width of the peninsular is further reduced down to 1 micron, the temperature decreasing rate is then more approaching to the relation inversely proportional to the cooling time duration. In this embodiment, the line peninsula 301 re-crystallizes first, and then the crystal growth is following the directions as indicated by the arrows in FIG. 2A. As a result, the whole semiconductor island 30, serving as the active region, can be crystallized by a single-crystal structure.

The subsequent processes for fabricating the TFT are described in FIGS. 3A–3G. In FIG. 3E, gate insulating layer 40 is formed over the substrate 10 by, for example, the chemical vapor deposition (CVD), such as the plasma enhanced CVD (PECVD) using tetra-ethy-ortho-silicate (TEOS) material, or an oxidation process to form the silicon oxide layer. The gate insulating layer 40 can also be formed before the laser annealing process on the a-Si film 30. In this manner, the gate insulating layer 40 with the a-Si film 30 can also be annealed in high temperature at the same time. Subsequently, a gate electrode layer 50 is formed on the gate insulating layer 40. The gate electrode layer 50 can be formed by, for example, depositing a conductive layer, such as Ta metal layer, over the gate insulating layer 40, and then patterning the conductive layer to form the gate electrode 50 as shown in FIG. 3B. In FIGS. 3C and 3G, the gate electrode layer 50 is used as a mask, an implantation process is performed, so as to form the source electrode 30a and the drain electrode 30b in the c-Si film 30, which is resulting from the a-Si film 30 being re-crystallized into single crystal structure. An insulating layer serving as the dielectric inter-layer layer 60, such as silicon oxide, is deposited over the gate insulating layer 40 and the gate electrode layer 50 by a thickness, such as 500 nm. An annealing process, such as furnace annealing or laser annealing, is performed to activate the dopants in the source/drain electrodes 30a, 30b and improve the quality of the gate insulating layer 40. The gate insulating layer 40 and the dielectric inter-layer 60 then is patterned to form contact openings 80 to expose the source/drain electrodes 30a, 30b and then the metal, such as Al, is deposited on the dielectric inter-layer 60 and on the contact openings 80, and then is patterned to form the source/drain leading line to accomplish the TFT.

Further still in FIG. 3D, the line peninsula 301 can also be arranged along the direction of the gate electrode 50 being overlapping. After an implantation process with desired conductive type of dopants on the line peninsula 301, the line peninsula 301 can be used as a lateral body terminal, so as to remove a kink effect.

Embodiment 3

Usually, the glass substrate or plastic substrate for the TFT cannot endure the temperature greater than 500° C. In embodiment 1, the high temperature annealing process, such as at 900° C., cannot be performed. However, the thermal diffusion depth for the annealing process at 500° C. is less than 0.5 microns, and the width of the line peninsula 301 is necessary to be sufficiently reduced. This would cause the difficulty for fabrication. In order to solve this problem, the invention uses a technology of semi-transparent film as disclosed by technical paper on AMLCD02 p153. The semi-transparent film during the laser annealing can prolong the melting duration and then increase the thermal diffusion depth. In addition to the increase in diffusion depth, the following effect also allows the restriction on the width for the peninsula 301 to be loose. In FIG. 1B, the laser light source 5 irradiates from the backside of the substrate 10, a portion of laser light transmits the semi-transparent film 20 and then reach to the semiconductor layers 1 and 2. At this situation, about 50% of laser light is reflected back to the semi-transparent film 20 by the surface of the semiconductor layers 1 and 2. The reflected laser light is then again partially absorbed by the semi-transparent film 20. At this moment, the laser light enters the region without being covered by the semiconductor layer will transmit away. As a result, the temperature of the semi-transparent film 20 at the region without being covered by the semiconductor layer is less than the temperature at the region having the semiconductor layer. As a result, the effect for the lateral thermal flux 4 is increased, and the temperature decreasing rate at the peninsula region 2 will be faster. These allows the restriction on the width for the peninsula 301 in FIG. 2A to be loose.

In the embodiment, the processes are similar to FIGS. 2A and 2C, which drawing are used for descriptions. However, the difference is that the buffering layer 20 is replaced by the semi-transparent layer 20. The processes are similar.

For example, a semi-transparent layer 20 is formed on the substrate 10. The SiONC material is used as semi-transparent layer for example. The deposition method includes, for example, performing PECVD with tetramethylsilane, oxygen, and nitrogen as the sources to form the semi-transparent layer 20 with a thickness of, for example, 800 nm and with the absorbing coefficient of 12000 $cm^{-1}$. Then, $SiO_2$ as a buffering layer 25 is formed on the semi-transparent layer 20. An amorphous silicon layer 30 is formed on the buffering layer 25 by, for example, LPCVD with a thickness of, for example, 100 nm. The a-Si layer 30 is patterned to have the semiconductor island 30 with length of 5 microns. And the peninsula 301 has the width of, for example, about 2 microns, and preferably is less than 1 micron. In addition, for example, before forming the a-Si layer 30 layer, a semi-transparent layer with the absorption coefficient, for example, between 3000 $cm^{-1}$–20000 $cm^{-1}$ with respect to the laser annealing process can be formed. Also and, after forming the a-Si layer 30 layer further, a semi-transparent layer with the absorption coefficient, for example, 1000 cm$^{-1}$–10000 cm$^{-1}$ with respect to the laser annealing process can be formed. The semi-transparent layer is used to prolong the cooling time duration during the laser annealing process.

Then an excimer laser irradiates the substrate from the backside. For this situation, the thermal diffusion depth is estimated to be about 1 micron. The semiconductor island 30 has the size of 5 microns×5 microns, which is thereby approaching to the planar thermal diffusion source with the temperature decreasing rate inversely proportional to square root of cooling time duration. Even though the peninsula 301 has the width of 2 microns greater than thermal diffusion depth, since the temperature for the peninsula can reduced in a faster rate, the line thermal diffusion is achieved with the temperature decreasing rate about inversely proportional to the cooling time duration. As a result, the line peninsula 301 re-crystallizes first, and then the crystal growth is following the directions as indicated by the arrows in FIG. 2A. The whole semiconductor island 30, serving as the active region, can be crystallized by a single-crystal structure.

Likewise, the subsequent processes for fabricating the TFT are described in FIGS. 3A–3G. In FIGS. 3A and 3E, gate insulating layer 40 is formed over the substrate 10 by, for example, PECVD using tetra-ethy-ortho-silicate (TEOS) material, or a oxidation process to form the silicon oxide layer. The gate insulating layer 40 can also be formed before the laser annealing process on the a-Si film 30. In this manner, the gate insulating layer 40 with the a-Si film 30 can also be annealed in high temperature at the same time. Subsequently, a gate electrode layer 50 is formed on the gate insulating layer 40. The gate electrode layer 50 can be formed by, for example, depositing a conductive layer, such as Ta metal layer, over the gate insulating layer 40, and then patterning the conductive layer to form the gate electrode 50 as shown in FIG. 3B. In FIGS. 3C and 3G, the gate electrode layer 50 is used as a mask, an implantation process is performed, so as to form the source electrode 30a and the drain electrode 30b in the c-Si film 30, which is resulting from the a-Si film 30 being re-crystallized into single crystal structure. An insulating layer serving as the dielectric inter-layer layer 60, such as silicon oxide, is deposited over the gate insulating layer 40 and the gate electrode layer 50 by a thickness, such as 500 nm. An annealing process, such as furnace annealing or laser annealing, is performed to activate the dopants in the source/drain electrodes 30a, 30b and improve the quality of the gate insulating layer 40. The gate insulating layer 40 and the dielectric inter-layer 60 then are patterned to form contact openings 80 to expose the source/drain electrodes 30a, 30b and then the metal, such as Al, is deposited on the dielectric inter-layer 60 and on the contact openings 80, and is patterned to form the source/drain leading line to accomplish the TFT.

Further still in FIG. 3D, the line peninsula 301 can also be arranged along the direction of the gate electrode 50 being overlapping. After an implantation process with desired conductive type of dopants on the line peninsula 301, the line peninsula 301 can be used as a lateral body terminal, so as to remove a kink effect.

Embodiment 4

In the embodiment, the invention uses a technology of semi-transparent capping layer as disclosed by Japanese Journal of Applied Physics Vol. 41 (2002) pp. 1909–1914. The semi-transparent capping layer during the laser annealing can prolong the melting duration and then increase the thermal diffusion depth. In addition to the increase in diffusion depth, the following effect also allows the restriction on the width for the peninsula 301 in FIG. 2A to be loose. In FIG. 1C, the laser light source 5 irradiates from the front side of the substrate 10, a portion of laser light transmits the semi-transparent film 20 and then reach to the semiconductor layers 1 and 2. At this situation, about 50% of laser light is reflected back to the semi-transparent film 20 by the surface of the semiconductor layers 1 and 2. The reflected laser light is then again partially absorbed by the semi-transparent film 20. At this moment, the laser light enters the region without being covered by the semiconductor layer will transmit away into substrate. As a result, the temperature of the semi-transparent film 20 at the region without being covered by the semiconductor layer is less than the temperature at the region having the semiconductor layer. As a result, the effect for the lateral thermal flux 4 is increased, and the temperature decreasing rate at the peninsula region 2 will be faster. This allows the restriction on the width for the peninsula 301 in FIG. 2A to be loose.

In the embodiment, the processes are shown in FIGS. 2A and 2D. For example, an amorphous silicon layer 30 is formed on the substrate 10 by, for example, LPCVD with a thickness of, for example, 40 nm. The a-Si layer 30 is patterned to have the semiconductor island 30 with length of 5 microns. And the peninsula 301 has the width of, for example, about 2 microns, and preferably is less than 1 micron. Then, SiO2 as a buffering layer 25 is formed on the surface. Then, a semi-transparent layer 20 is formed on the buffering layer 25. The SiONC material is used as semi-transparent layer for example. The deposition method includes, for example, performing PECVD with tetramethylsilane, oxygen, and nitrogen as the sources to form the semi-transparent layer 20 with a thickness of, for example, 800 nm and with the absorbing coefficient of 4000 cm$^{-1}$.

Then a laser, such as excimer laser irradiate the substrate from the front side. For this situation, the thermal diffusion depth is estimated to be about 1 micron. The semiconductor island 30 has the size of 5 microns×5 microns, which is thereby approaching to the planar thermal diffusion source with the temperature decreasing rate inversely proportional to square root of cooling time duration. Even though the peninsula 301 has the width of 2 microns greater than thermal diffusion depth, since the temperature for the peninsula can reduced in a faster rate, the line thermal diffusion is achieved with the temperature decreasing rate about inversely proportional to the cooling time duration. As a result, the line peninsula 301 re-crystallizes first, and then the crystal growth is following the directions as indicated by the arrows in FIG. 2A. The whole semiconductor island 30, serving as the active region, can be crystallized by a single-crystal structure.

After the etching of semitransparent film 20 and buffer film 25 on Si film in FIG. 2D, likewise, the subsequent processes for fabricating the TFT are described in FIGS. 3A–3G. In FIGS. 3A and 3E, gate insulating layer 40 is formed over the substrate 10 by, for example, PECVD using tetra-ethy-ortho-silicate (TEOS) material, or a oxidation process to form the silicon oxide layer. The semitransparent film 20 and buffer film 25 in FIG. 2D can also be reserved to use as gate insulating layer 40 in this manner. Subsequently, a gate electrode layer 50 is formed on the gate insulating layer 40. The gate electrode layer 50 can be formed by, for example, depositing a conductive layer, such as Ta metal layer, over the gate insulating layer 40, and then patterning the conductive layer to form the gate electrode 50 as shown in FIGS. 3B and 3F. In FIGS. 3C and 3G, the gate electrode layer 50 is used as a mask, an implantation process is performed, so as to form the source electrode 30a and the drain electrode 30b in the c-Si film 30, which is resulting from the a-Si film 30 being re-crystallized into single crystal structure. An insulating layer serving as the dielectric inter-layer layer 60, such as silicon oxide, is deposited over the gate insulating layer 40 and the gate electrode layer 50 by a thickness, such as 500 nm. An annealing process, such as furnace annealing or laser annealing, is performed to activate the dopants in the source/drain electrodes 30a, 30b and improve the quality of the gate insulating layer 40. The gate insulating layer 40 and the dielectric inter-layer 60 then are patterned to form contact openings 80 to expose the source/drain electrodes 30a, 30b. Then, the metal, such as Al, is deposited on the dielectric inter-layer 60 and on the contact openings 80, and is patterned to form the source/drain leading line to accomplish the TFT.

Further still in FIG. 3D, the line peninsula 301 can also be arranged along the direction of the gate electrode 50 being overlapping. After an implantation process with desired conductive type of dopants on the line peninsula 301, the line peninsula 301 can be used as a lateral body terminal, so as to remove a kink effect.

The embodiment mentioned above is the examples where the whole semiconductor island 30 in FIG. 2A can be crystallized by a single-crystal structure, but when the size of the semiconductor island is overlarge, semiconductor island cannot be crystallized in single crystal in the active region. In this condition, as shown in FIG. 4A, the peninsula 301 can be formed beside the position where the channel will be planed to form and thus at least produce a single crystal 30c at the channel region. The area around the single crystal 30c is polysilicon 30d, which is used by the source electrode 30a and the drain electrode 30b. As a result, the device property is not affected.

In addition, the active semiconductor islands are not always necessary to be separated. As shown in FIG. 4B, it may only need to have the single-crystal crystallization at the desired area by forming the line peninsulas 301.

Figure 5A:
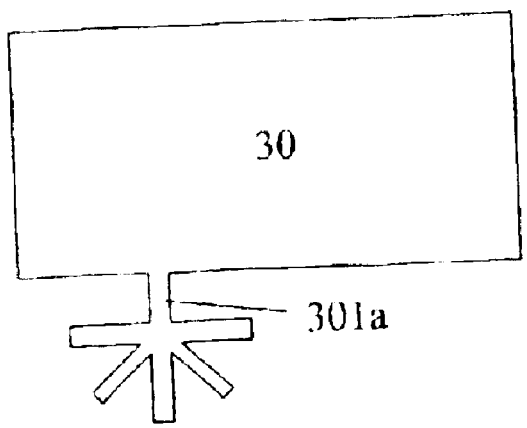
FIGS. 5A–5C are top views, schematically illustrating various structure of the line-like peninsula structure, according to embodiments of the invention.

In the foregoing peninsular structures, a line structure is illustrated. However, the peninsula 301 can also be replaced by any shapes, for example, shown in FIGS. 5A–5C. In FIG. 5A, the peninsula 301 can has several branches at the end. Since the path to the semiconductor 30 has the only path 301a, the first one of the branches reaches to the portion 301a in crystallization will dominate. Since crystallization speed with respect to the directions, such as <111>, <110>, and <100>, is different, the direction on <100> will first reach to the portion of peninsula 301a. The lattice can be controlled, and the electrical property of the semiconductor can be in better uniform. In the FIG. 5B, the peninsula 301 can also be bent by 90 degrees. The effect is similar to FIG. 5A, so as to allow the crystallization occurs at one direction.

Figure 5B:
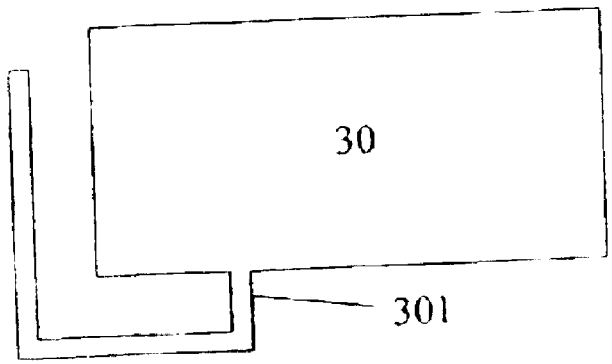
Figure 5C:
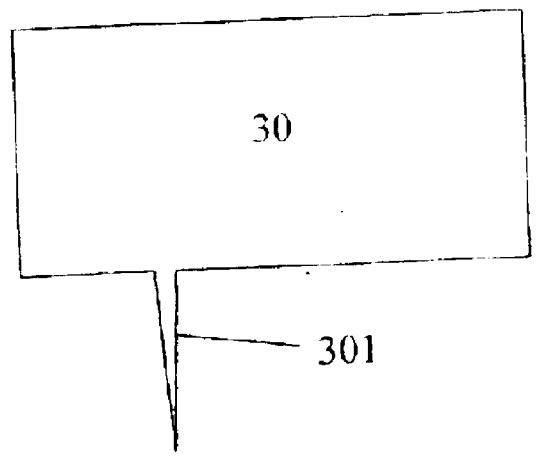

Moreover, the peninsula structure can also be an acute protruding structure, as shown in FIG. 5C. Since the heat will dissipate from the acute end, the temperature will decrease faster, so as to ensure the crystallization starts from here.

Also and the structures as shown in FIGS. 5A–5C can also be arranged like FIG. 3D. After an implantation process with desired conductive type of dopants on the line peninsula 301, the line peninsula 301 can bed used as a lateral body terminal, so as to remove a kink effect.

In addition, the laser light source can be KrF, XeCl and XeF excimer laser for annealing process. However, the type of laser is not limited to those. For example, the YAG laser can also be used.

Furthermore, the TFT as shown in the invention does not include the lightly-doped drain (LDD) structure. Actually, the LDD structure can also be included. It cal also include a GOLD structure.

In conclusion, the invention uses the laser annealing to transform, for example, the a-Si into at the semiconductor island, which at least include the channel region of TFT, into single crystal, so as to accomplish the single-crystal TFT. The invention can improve the conventional technology and the device characteristics can be more uniform.

It will be apparent to those skilled in the art that various modifications and variations can be made to the structure of the present invention without departing from the scope or spirit of the invention. In view of the foregoing, it is intended that the present invention covers modifications and variations of this invention provided they fall within the scope of the following claims and their equivalents.

What is claimed is:

1. A method for fabricating a semiconductor active layer in a thin film transistor (TFT), comprising:

providing a substrate;

depositing a semiconductor layer over the substrate;

patterning the semiconductor layer to have a semiconductor island and a peninsula structure extending laterally from the semiconductor island, wherein peninsula structure has a width; and performing a laser annealing process on the semiconductor island and the peninsula structure, whereby the semiconductor island serves as the active layer, wherein the width of the peninsula structure produces a line thermal diffusion, and the semiconductor island is under a planar thermal diffusion, wherein a re-crystallization occurs first from the peninsula structure.

2. The method of claim 1, further comprising forming a lateral body terminal on the peninsula structure.

3. The method of claim 1, wherein the width of the peninsula structure is about equal to or less than a thermal diffusion depth.

4. The method of claim 1, wherein the width of the peninsula structure is about equal to or less than 2 microns when an area of the semiconductor island is greater than 3 microns×3 microns.

5. The method of claim 1, wherein the active layer include a channel region of the TFT.

6. The method of claim 1, before the step of forming the semiconductor layer further comprising forming a porous dielectric layer.

7. The method of claim 1, before the step of forming the semiconductor layer further comprising forming a semi-transparent layer which have the absorption coefficient between 3000 $cm^{-1}$–20000 $cm^{-1}$ with respect to the laser annealing process.

8. The method of claim 1, after the step of forming the semiconductor layer further comprising forming a semi-transparent layer which have the absorption coefficient between 1000 $cm^{-1}$–10000 $cm^{-1}$ with respect to the laser annealing process.

9. The method of claim 1, wherein the semiconductor layer include silicon.

10. The method of claim 1, wherein the step of patterning the semiconductor layer includes forming the peninsula structure with one structure selected from the group consisting of a straight line, an acute line, a bent line, and a multiple branched end.

11. A method for forming a semiconductor layer tending to have a single crystal structure, comprising:

forming a semiconductor layer over a substrate;

patterning the semiconductor layer to form an island part with an protruding part, wherein the protruding part extends laterally from the island part; and performing a laser annealing process on the island part with the protruding part, wherein the protruding part has a width to have re-crystallization occurring first.

12. The method of claim 11, wherein in the step of performing the laser annealing process, the island part and the protruding part are melt and re-crystallized.

13. The method of claim 11, wherein the width of the protruding part is controlled to produce a line thermal diffusion source with respect to the laser annealing process, while the island part is a planar thermal diffusion source.

14. The method of claim 11, before forming the semiconductor layer over the substrate, a porous dielectric layer has already been formed over.

15. The method of claim 11, before forming the semiconductor layer over the substrate, a semi-transparent layer which have the absorption coefficient of between 3000 cm$^{-1}$–20000 cm$^{-1}$ has already been formed over, wherein the semi-transparent layer absorb a portion of laser light into heat to prolong a cooling time duration.

16. The method of claim 15, wherein the laser annealing process comprising irradiating a laser light from a backside of the substrate.

17. The method of claim 15, wherein the protruding part is patterned as one selected from the group consisting of a straight line peninsular, a bent line, an acute line, and a line with branches at an end.

18. The method of claim 11, after forming the semiconductor layer over the substrate, a semi-transparent with the absorption coefficient of between 1000 cm$^{-1}$–10000 cm$^{-1}$ layer is formed over, wherein the semi-transparent layer absorb a portion of laser light into heat to prolong a cooling time duration.

19. The method of claim 18, wherein the laser annealing process comprising irradiating a laser light from a frontside of the substrate.

20. The method of claim 18, wherein the protruding part is patterned as one selected from the group consisting of a straight line peninsular, a bent line, an acute line, and a line with branches at an end.

21. A semiconductor structure layer, which is to be transformed into a single crystal structure under an annealing operation, the semiconductor structure layer comprising:

an island part diposed over a substrate; and an protruding part having a width, diposed over the substrate and extended laterally from the island part;

wherein the width of the protruding part is used to produce a first occurring place in re-crystallization during an annealing operation.

22. The semiconductor structure layer of claim 21, wherein the width of the protruding part is about equal to or less than a thermal diffusing length.

23. The semiconductor structure layer of claim 21, wherein the protruding part is a line thermal diffusion source.

24. A method for forming a semiconductor layer tending to have a single crystal structure, comprising:

forming a semiconductor layer over a transparent substrate;

patterning the semiconductor layer to form an island part with an protruding part; and irradiating a laser beam as an annealing process on the semiconductor layer from a side of the transparent substrate opposite to the semiconductor layer, wherein a portion of the laser beam is reflected back by the semiconductor layer and is at least partially absorbed by the substrate for producing a larger thermal effect on the island part than the protruding part of the semiconductor, so as to have a tendency to cause a re-crystallization starting from the protruding part.

25. The method of claim 24, wherein the semiconductor layer comprises an a-Si layer.

* * * * *